(12) United States Patent
Li

(10) Patent No.: US 11,387,425 B2
(45) Date of Patent: Jul. 12, 2022

(54) DISPLAY PANEL, DISPLAY APPARATUS, AND METHODS FOR MAKING THE SAME

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Qun Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 16/954,077

(22) PCT Filed: Jan. 6, 2020

(86) PCT No.: PCT/CN2020/070430
§ 371 (c)(1),
(2) Date: Jun. 15, 2020

(87) PCT Pub. No.: WO2020/186898
PCT Pub. Date: Sep. 24, 2020

(65) Prior Publication Data
US 2021/0234116 A1    Jul. 29, 2021

(30) Foreign Application Priority Data

Mar. 19, 2019 (CN) .......................... 201910208131.1

(51) Int. Cl.
*H01L 51/56* (2006.01)
*H01L 51/52* (2006.01)
*H01L 27/32* (2006.01)

(52) U.S. Cl.
CPC .......... *H01L 51/52* (2013.01); *H01L 27/3246* (2013.01); *H01L 51/56* (2013.01)

(58) Field of Classification Search
CPC ..................................................... H04N 1/1048
See application file for complete search history.

(56) References Cited

U.S. PATENT DOCUMENTS

2012/0062995 A1* 3/2012 Momoki ................ G02B 5/045
                                                        359/580
2020/0006606 A1* 1/2020 Shipton ............... H01L 33/0008

FOREIGN PATENT DOCUMENTS

| CN | 101271946 A | 9/2008 |
| CN | 103890617 A | 6/2014 |
| CN | 106206671 A | 12/2016 |

OTHER PUBLICATIONS

CN First Office Action in Application No. 201910208131.1, dated Feb. 3, 2020.

(Continued)

*Primary Examiner* — Fernando L Toledo
*Assistant Examiner* — Valerie N Newton
(74) *Attorney, Agent, or Firm* — Syncoda LLC; Feng Ma

(57) ABSTRACT

A display panel includes: a plurality of light emitting units each having a light emitting side and a back side; a transparent substrate disposed over the light emitting side of the light emitting unit; a transparent film disposed over a side of the transparent substrate opposing the light emitting unit, wherein: the transparent film has an effective refractive index smaller than a refractive index of the transparent substrate; and the transparent film has a position-dependent refractive index progressively smaller along a light emitting direction from the light emitting unit.

16 Claims, 7 Drawing Sheets

(56) References Cited

OTHER PUBLICATIONS

International Search Report in Application No. PCT/CN2020/070430, dated Mar. 27, 2020.

* cited by examiner

DISPLAY PANEL, DISPLAY APPARATUS, AND METHODS FOR MAKING THE SAME

CROSS-REFERENCE TO RELATED APPLICATIONS

The present application is a national stage of International Application No. PCT/CN2020/070430 filed on Jan. 6, 2020, which claims priority to Chinese Patent Application No. 201910208131.1 filed on Mar. 19, 2019. The disclosures of these applications are hereby incorporated by reference in their entirety.

FIELD

The present disclosure relates generally to the field of display technologies, and more specifically to a display panel, a method for fabricating the same, and a display apparatus.

BACKGROUND

With the rapid development of display technology, electronic displays have entered all aspects of people's lives. In particular, the popular use of smart terminals has placed an ever-increasing demand on the quality and performance of displays.

SUMMARY

Various embodiments of the present disclosure provide a display panel, a manufacturing method thereof, and a display apparatus.

In a first aspect, a display panel is provided, including:
a plurality of light emitting units each having a light emitting side and a back side;
a transparent substrate disposed over the light emitting side of the light emitting unit;
a transparent film disposed over a side of the transparent substrate opposing the light emitting unit,
wherein:
the transparent film has an effective refractive index smaller than a refractive index of the transparent substrate; and
the transparent film has a position-dependent refractive index progressively smaller along a light emitting direction from the light emitting unit.

In some embodiments:
the transparent film is patterned as a plurality of convex structures protruding away from the plurality of light emitting units; and
the plurality of convex structures and the plurality of light emitting units have a one-to-one correspondence.

In some embodiments, each of the plurality of convex structures is configured to have a centrally symmetric shape with respect to an equivalent illuminating center point of a corresponding light emitting unit.

In some embodiments, each of the plurality convex structures is configured to be a spherical cap that is smaller or equal to a hemisphere or a conic shape.

In some embodiments, each of the plurality convex structures includes at least a first transparent film sublayer and a second transparent film sublayer, with the first sublayer being closer to the plurality of light emitting units and the second sublayer being farther away from the light emitting units.

In some embodiments, the first sublayer includes magnesium fluoride, and the second sublayer includes cryolite.

In some embodiments:
the first sublayer has an edge with a plane section forming an angle with the surface plane of the transparent substrate that is equal to or greater than 20 degrees; and
the second sublayer has an edge with a plane section forming an angle with the surface plane of the transparent substrate that is equal to or greater than 20 degrees.

In some embodiments, the transparent film has a gradually varying refractive index through doping or through a gradual variation in a material composition along the light emitting direction from the light emitting unit.

In some embodiments, the transparent film has stepped refractive indices through stepped doping or through stepped variation in a material composition along the light emitting direction from the light emitting unit.

In some embodiments:
the transparent film includes a plurality of sublayers; and
each of the plurality of sublayers has a refractive index progressively smaller than a refractive index of a previous layer that is closer to the light emitting unit.

In some embodiments, the plurality of sublayers includes:
a first layer proximal to the light emitting unit and having a first refractive index of 1.4; and
a second layer over the first layer and having a second refractive index of 1.33.

In some embodiments:
the first layer includes $MgF_2$; and
the second layer includes cryolite.

In some embodiments:
the first sublayer has an edge with a plane section forming an angle with the surface plane of the transparent substrate that is equal to or greater than 20 degrees; and
the second sublayer has an edge with a plane section forming an angle with the surface plane of the transparent substrate that is equal to or greater than 20 degrees.

In some embodiments:
each of the plurality of light emitting units includes a top emitting organic light-emitting diode (OLED);
the display panel further includes: a base substrate and a protective cover that functions as the transparent substrate; and
each of the plurality of light emitting units is disposed between the base substrate and the protective cover.

In some embodiments:
each of the plurality of light emitting units includes a bottom emitting organic light-emitting diode (OLED);
the display panel further includes: a base substrate and a protective cover that functions as the transparent substrate; and
each of the plurality of light emitting units is disposed between the base substrate and the protective cover.

In another aspect, a display apparatus is provided, including the display panel described above, and further including a control circuit including an array of thin-film transistors (TFTs).

In another aspect, a method of manufacturing a display panel is provided, including:
forming a plurality of light emitting units and a transparent substrate disposed on a light emitting side of the plurality of light emitting units;
disposing a transparent film on a side of the transparent substrate that is opposing the plurality of light emitting units, wherein the transparent film includes a plurality of sublayers; and each sublayer of the transparent film has a refractive index smaller than that of the transparent substrate, and each sublayer's refractive index is progressively smaller than the previous sublayer ordered in a light-emitting direction.

In some embodiments, the method further includes:

forming the plurality of sublayers one layer at a time, and patterning each sublayer into a plurality of convex structures after each sublayer is formed, wherein each of the plurality of convex structures corresponds to a light emitting unit in a one-to-one correspondence.

In some embodiments, the method further includes:

forming the sublayers one layer at a time, and patterning the entire transparent film to form a plurality of convex structures in a single patterning process after all the sublayers are formed, wherein each of the plurality of convex structures correspond to each light emitting units in a one-to-one correspondence.

In some embodiments, the method further includes:

forming an anode over the transparent substrate;

forming a pixel defining layer over the anode.

forming an organic functional layer over the anode at which the pixel defining layer is formed;

forming a cathode over the organic functional layer;

wherein the organic functional layer corresponds to a light-emitting area at the light-emitting side;

depositing, with a chemical vapor deposition (CVD) process, the transparent film including a MgF2 film sublayer, and a cryolite (n=1.33) film sublayer;

performing exposure with a variable transmittance mask; and forming a convex structure over surface of the cryolite film sublayer, having an edge with a plane section forming an angle with the surface plane of the transparent substrate that is equal to or greater than 20 degrees.

Other embodiments may become apparent in view of the following descriptions and the attached drawings.

BRIEF DESCRIPTION OF THE DRAWINGS

Exemplary embodiments of the present disclosure will now be described, by way of example only, and with reference to the accompanying drawings of which.

DETAILED DESCRIPTION

Various embodiments of the present disclosure will be further described in detail with reference to the accompanying drawings. When the following description refers to the drawings, the same numbers in different drawings represent the same or similar elements, unless otherwise indicated. It will be understood that the specific embodiments described herein are for illustrative purpose only and shall not be construed as limiting. All other embodiments obtained by a person of ordinary skill in the art based on the embodiments of the present disclosure without are within the scope of the present disclosure.

Displays are generally based on liquid-crystal display (LCD) technologies or organic light-emitting diode (OLED) technologies. Regardless of which display technology is used, a transparent protective external cover is generally included.

The difference between the refractive index of the cover plate and the refractive index of the environment (e.g., air) causes the large-angle light emitted by the display to be totally reflected when it enters the boundary between the protective cover and the environmental medium, and cannot be emitted outward. This phenomenon causes differences in brightness of the display at different viewing angles.

Many display apparatuses are generally provided with a protective cover on the outside for protecting the light-emitting device. Typically, a glass material is used for such protective covers.

Figure 1:
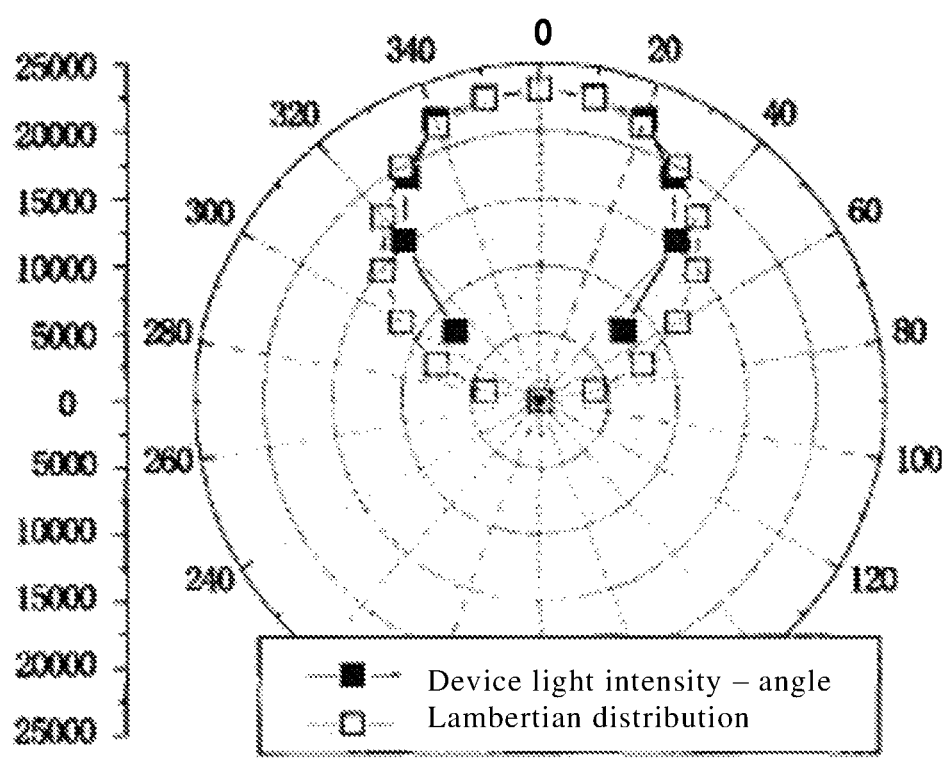
FIG. 1 is a comparison diagram of a standard Lambertian distribution and an actual light intensity distribution of a light-emitting device in the prior art.

Taking an OLED display as an example, FIG. 1 shows an exemplary "brightness-viewing angle" characteristic curve of an OLED device when operating at 9V.

Referring to FIG. 1, the line connecting the white squares represents the standard Lambertian distribution curve of the OLED device, and the line connecting the black squares represents the actual viewing angle and light intensity distribution curve of the OLED device.

As can be seen from FIG. 1, when the viewing angle of the OLED device is greater than 40°, a considerable separation occurs between the brightness and the standard Lambertian distribution curve. At these larger viewing angles, the luminous intensity of the device is greatly reduced.

This is because the refractive index of the glass relative to the air (the environment in which the device is exposed) is high, when the light emitted from the OLED incidents on the protective glass at a large angle (corresponding to a large viewing angle), the large refractive index at the interface of air and the glass will result in total reflection.

Figure 2:
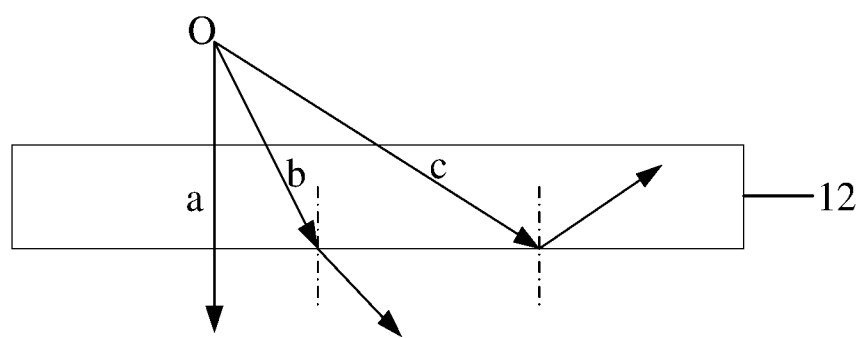
FIG. 2 is a schematic diagram of an optical path according to some embodiments of the present disclosure.

In addition, due to the anisotropy of the organic semiconductor materials, and the microcavity effect between the cathode and the cathode of the OLED display apparatus, when the photons are coupled out from one side, the difference in brightness and the drift of the chromaticity will also be exhibited at different viewing angles Referring to FIG. 2, there are shown three light rays a, b, and c emitted from the OLED, each incident on the protective glass at a progressively larger angle.

Light ray a is incident on the glass perpendicularly, light ray b incidents at a smaller angle than the critical angle, and light ray c incidents at an angle greater than or equal to the critical angle. According to the principle of total reflection of light, when a light ray is incident at an angle greater than or equal to a critical angle at an interface of two media with different refractive indices, the ray will be completely reflected. Due to this phenomenon, light emitted from the OLED that is incident at the protective glass at an angle larger than the critical angle of the glass-air interface cannot pass through the protective glass. Consequently, the brightness of the display at a large viewing angle will be different from looking at the display straight on.

In view of this, in a first aspect, embodiments of the present disclosure provide a display panel having a reduced difference in brightness at different viewing angles.

Figure 3:
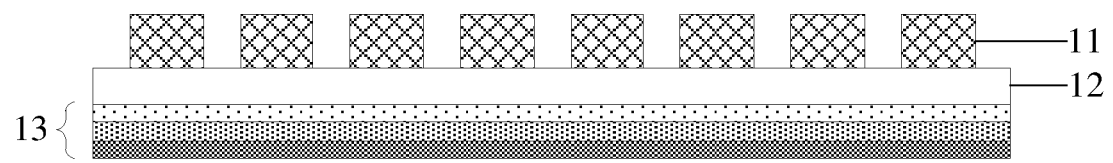
FIG. 3 is a schematic cross-sectional structural view of a display panel according to some embodiments of the present disclosure.

As shown in FIG. 3, a display panel according to some embodiments of the present disclosure includes: a plurality of light emitting units 11, a transparent substrate 12 disposed on the light emitting side of the light emitting unit 11, and a transparent film 13 having one or more sublayers disposed on the side of the transparent substrate 12 opposite of the light emitting units.

In the exemplary embodiment of FIG. 3, three sublayers of the transparent film 13 are shown. Here, each of the three sublayers of the transparent film 13 has a refractive index smaller than that of the transparent substrate 12. Moreover, each sublayer has a progressively decreasing value of refractive index in the direction moving away from the light emitting elements.

That is, the sublayer closest to the light emitting elements 11 will have the largest refractive index while the sublayer furthest away from the light emitting elements 11 will have the smallest refractive index.

The above display panel provided by the embodiment of the present disclosure is generally in an air environment where the refractive index of the air is 1, and the refractive index of each of the sublayers of transparent film 13 is generally greater than the refractive index of the air.

At least one sublayer of transparent film 13 whose refractive index is progressively reduced in the direction away from the light-emitting elements 11 is disposed on the transparent substrate 12 on the light emitting side of the light emitting unit 11 so that the differences in the refractive indices of the media when the light is emitted to the outside of the transparent substrate is reduced.

Through this layered structure, the critical angle of the interface is increased, and the light emitted from a large angle can pass through the layers, thereby alleviating the problem of low light intensity at a large viewing angle.

Figure 4:
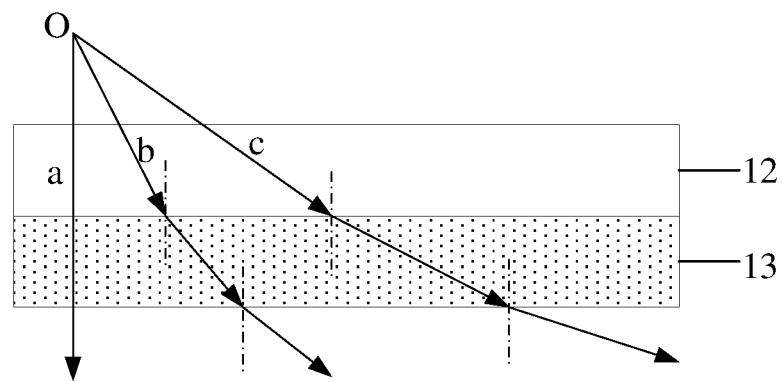
FIG. 4 is one exemplary schematic diagram showing optical paths according to some embodiments of the present disclosure.

FIG. 4 illustrates the physics of the above structure as light rays are incident on the substrate at an increasingly large angle. Here the same three different angles of light rays a, b, and c as shown in FIG. 2 emitted by the same OLED incident on the transparent substrate 12, each at an increasingly larger angle of incidence.

In conventional displays, light rays a and b could pass through the glass, but not light ray c. In FIG. 4, both light rays a and b can still pass through the protective cover made up of the substrate 12 and the transparent film 13. In contrast, light ray c which was previously unable to pass through the glass in conventional displays now can pass through both the transparent substrate 12 and the transparent film 13.

This is because in the structure of FIG. 4, the differences in the refractive indices between substrate 12 and transparent film 13 is reduced as compared with the glass-air interface. The difference allows emitted light to pass through the display cover at a larger critical angle.

Further, the differences between the refractive index of the transparent film 13 and the refractive index of the environmental medium (for example, the refractive index of air is 1) is also smaller than the difference between the refractive index of the transparent substrate 12 and the environmental medium. Therefore, even if a light ray incident at a large angle to the transparent film 13, the incident angle can still be smaller than the critical angle of the interface such that the light ray is transmitted outwardly, thereby, resulting in an increased light output intensity of the display panel at a larger viewing angle, reducing the brightness difference at various viewing angles.

Figure 5:
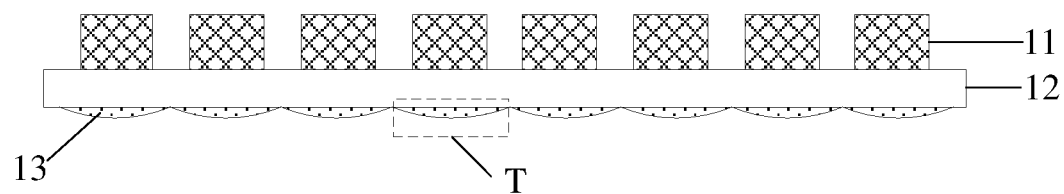
FIG. 5 is another exemplary schematic structural diagram of a display panel according to some embodiments of the present disclosure.

In some embodiments shown in FIG. 5, each transparent film 13 may comprise a plurality of convex structures T protruding toward the side away from the light emitting unit 11.

In some embodiments, the plurality of convex structures T can have a one-to-one correspondence with each of the light-emitting units 11. This arrangement can effectively reduce the incident angle of light incident on the interface between the transparent film layer 13 and the environmental medium, thereby, allowing light to be passed through at a larger angle.

Figure 6:
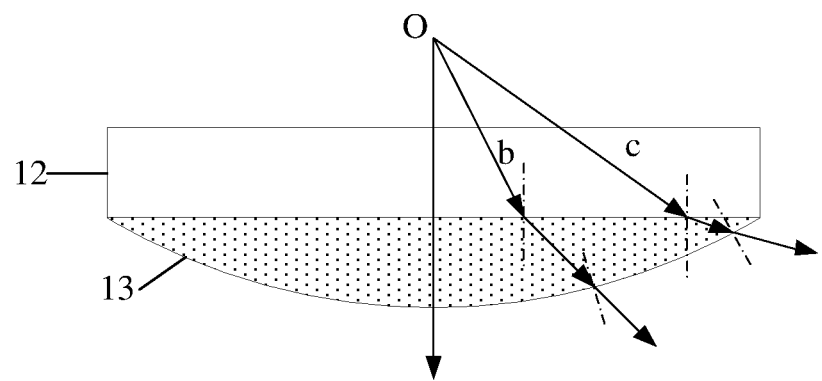
FIG. 6 is another exemplary schematic diagram showing optical paths according to some embodiments of the present disclosure.

FIG. 6 shows in detail the working principle of a convex structure T, using the same three incident lights as an example.

Referring to FIG. 6, there is shown the same three different angles of light rays a, b, and c emitted from the same origin O incident on transparent substrate 12 having a transparent film 13 in the shape of a convex lens T disposed thereon.

Comparing the same light rays b and c in FIGS. 4 and 6, one can see that since the transparent film 13 is shaped as a convex structure T, its outer surface has a certain slope angle with respect to the transparent substrate 12.

When a light ray is incident on the outer surface, the incident angle with respect to the normal of this curved surface is reduced compare to the angle at the interface of substrate 12 and transparent film 13.

This way, when compared with the construct in FIG. 4, even though the refractive indices of the two layers of media may be the same, the effective incident angles are much smaller in FIG. 6. Hence, more light rays may exit out of the transparent film 13 to achieve a much larger viewing angle.

In some embodiments, because the emitted light of the light-emitting unit 11 is emitted toward the transparent substrate 12 in a centrally diverging manner, the convex structure T corresponding to the light-emitting unit 11 can be correspondingly disposed with respect to the corresponding light-emitting unit.

In this way, the equivalent illuminating center point has a centrally symmetrical structure so that the light of the light-emitting unit 11 can be better received, and the emission intensity of the large-angle light of each of the light-emitting units 11 can be increased.

Generally, the geometric center point of the light-emitting surface of the light-emitting unit can be used as the above-mentioned equivalent light-emitting center point, and the light-emitting unit can be equivalent to the point light source in practice, which can reduce the difficulty of simulating the shape of the convex structure.

Figure 7:
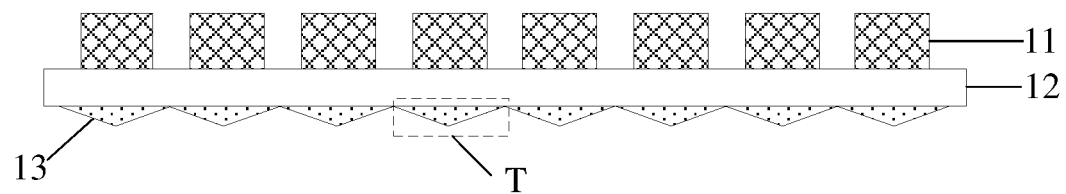
FIG. 7 is another exemplary schematic structural diagram of a display panel according to some embodiments of the present disclosure.

In some other embodiments, as shown in FIG. 5, each convex structure T may be set to be smaller than or equal to a hemispherical spherical body, or, alternatively, each convex structure T may be set as a cone as shown in FIG. 7.

In addition, in accordance with principles of the present disclosure, the effective incident angles of light rays may be reduced at the periphery of light emitting units 11 where the emitted light is hitting substrate 12 at a large angle by disposing a convex structure T on substrate 12 so as to form a surface slope. Thus, any embodiment that utilizes the above principle, regardless of the specific shape of implementation (e.g. spherical cap, semispherical, pyramidal, conic, etc.), are all within the scope of the present disclosure.

In some implementations, the transparent substrate 12 is usually made of a glass material, and the display panel is usually placed in an air environment wherein the refractive index of the glass material is about 1.5, and the refractive index of the air is 1.

To achieve a smaller transition of refractive index between the transparent substrate 12 and air, in some embodiments, the transparent film may comprise two sublayers disposed on top substrate 12.

Figure 8:
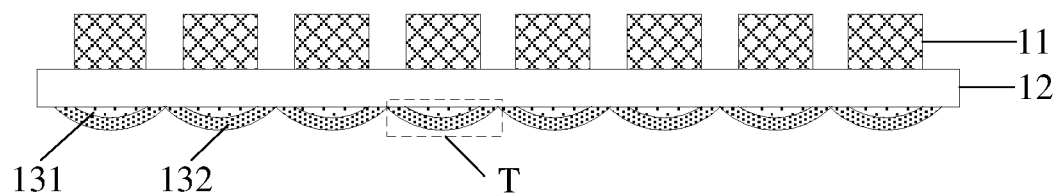
FIG. 8 is yet another schematic structural diagram of a display panel according to some embodiments of the present disclosure.

In yet some other embodiments, as shown in FIG. 8, the convex structure T includes at least: a first transparent film sublayer 131 and a second transparent film sublayer 132 which are disposed in sequence along the light emitting direction of the light emitting unit 11.

The refractive index of the first transparent film sublayer 131 is smaller than of the transparent substrate 12, and the refractive index of the second transparent film sublayer 132, in turn, is smaller than the refractive index of the first transparent film sublayer 131. The refractive index of the environmental medium is smaller than that of the second transparent film sublayer 132.

In some embodiments, exemplary suitable material for the transparent substrate 12 can be a glass substrate having a refractive index of about 1.5. Materials suitable for the first transparent film sublayer 131 may be magnesium fluoride and can have a refractive index smaller than that of substrate 12.

In some embodiments, the transparent film sublayer 131 has a refractive index of about 1.4. The second transparent film sublayer 132 can have a refractive index smaller than that of the first layer. Suitable material for the second transparent film sublayer 132 may be cryolite. In some embodiments, the second film sublayer 132 has a refractive index of about 1.33. In the above embodiments, the formula for calculating the total reflection critical angle is: $\theta=\arcsin(n_2/n_1)$, where $\theta$ represents the critical angle of the multilayer construct, $n_1$ represents the refractive index of the more refractive medium, and $n_2$ represents the refractive index of the less refractive medium.

When the refractive indices of the two media are determined, the critical angle at which the two media have a total reflection at their interface is also determined.

When no transparent film is disposed on the surface of the transparent substrate 12, the light is directly refracted into the air by the transparent substrate 12, so the critical angle is 41 degrees (assuming the refractive index of substrate 12 is 1.5 and that of air is 1).

That is, any light incident on the substrate 12 at an angle larger than 41 degrees will be totally reflected by the transparent substrate 12 back into the display panel, resulting in low display brightness at large viewing angles. In comparison, when two flat layers of the transparent film sublayers 131 and 132 are disposed on top of the substrate 12, light that passes through transparent substrate 12 will not encounter air directly, but will incident on the magnesium fluoride film layer 131 first followed by the cryolite film sublayer 132.

The critical angle at the interface of the substrate 12 and the first transparent film sublayer 131 (calculated according to the above formula) is 69 degree, effectively increase the critical angle so that more light is transmitted across the boundary. When the light exiting the magnesium fluoride film sublayer incidents on the cryolite film layer, the critical angle of this interface is 72 degrees, so that light emitted to the magnesium fluoride film layer can be emitted to the cryolite film layer at a much larger angle.

Finally, when the light incidents on the cryolite-air interface, the critical angle is 48 degrees. It can be seen that while not 100% light is transmitted directly across the multiple layer construct, when compared with the case without any intermediate layer, the exit angle is greatly enlarged, and the total amount of light allowed to pass is increased.

In other embodiments, the first transparent film sublayer 131 and the second transparent film sublayer 132 are provided in a convex structure T corresponding to the light-emitting unit 11. Of note here is that when provided in a convex structure, the plane of the films disposed on substrate 12 forms a slope.

In this way, when a light ray enters the interfaces between the substrate 12 and the first layer 131, and then between the first sublayer 131 and then second sublayer 132, the incident angle is reduced at each interface compare to the same light ray without the T structures. In effect, this setup widens the gap between the critical angle of the interface and allows more large angles of light to exit.

Depending on the differences in the refractive indices of each transparent film layer in film layer 13, a suitable angle between the edge surfaces of the convex structure T and the transparent substrate 12 can be calculated.

When the first transparent film sublayer of magnesium fluoride and the second transparent film sublayer of cryolite are used, the angle between the edge surface of the first transparent film sublayer 131 and the transparent substrate 12 may be set to be greater than or equal to 20 degrees; the angle between the edge surface of film layer 132 and the transparent substrate 12 can be greater than or equal to 20 degrees.

This way, the angle of view of the light emerging from the interface between the cryolite layer and the air medium can be increased to 68 degrees. When the transparent film sublayer(s) are formed by using other materials, it is necessary to set the above-mentioned angles according to the refractive index of the actual materials selected for the transparent film sublayers.

An objective is to allow more light incident on the substrate 12 that would have otherwise been larger than the critical angle and be totally reflected to be passed by virtual of the added transparent film 13 which act to increase the effective critical angle and, thereby, reduce the brightness differences between the smaller and larger viewing angles.

In the above embodiments, the type of display panel is not particularly limited. The protective cover described above may be advantageously applied to OLED, LCD, or any other type of light emitting panel display commonly known in the art.

Figure 9:
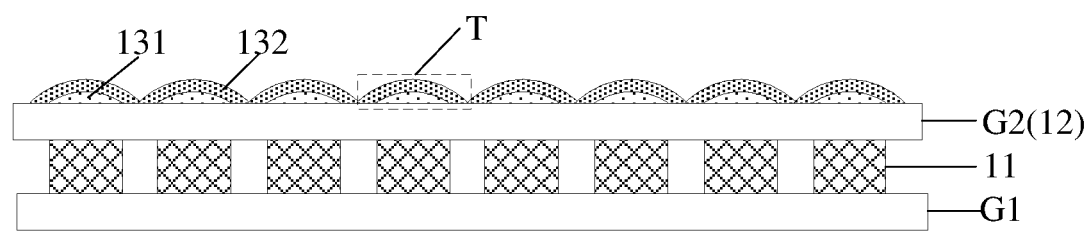
FIG. 9 is yet another schematic structural diagram of a cross-section of a display panel according to some embodiments of the present disclosure.

When the display is an OLED, it may be implemented as either a top-emitting panel or bottom-emitting panel. As shown in FIG. 9, when the light emitting unit 11 is a top emitting OLED device, the display panel includes a base substrate G1 and a protective cover G2; each of the light emitting units 11 is located between the base substrate G1 and the protective cover G2. In this embodiment, the protective cover G2 is the above-described transparent substrate 12, and, therefore, the transparent film layer 13 needs to be provided on the surface of the protective cover G2 as shown in the figure.

Figure 10:
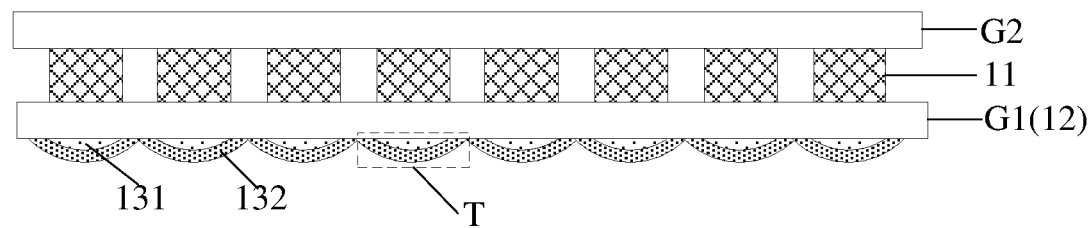
FIG. 10 is yet another schematic structural diagram of a display panel according to some embodiments of the present disclosure.

In FIG. 10, there is shown an exemplary embodiment in which the light emitting unit 11 is a bottom emitting OLED device. In this embodiment, the display panel includes: a base substrate G1 and a protective cover G2. Each of the light emitting units 11 is located between the base substrate G1 and the protective cover G2. Here the base substrate G1 serves as the above-described transparent substrate 12, and therefore the transparent film layer 13 needs to be provided on the surface of the base substrate G1.

In the OLED display panel, the organic light emitting diode device may include an anode, a light emitting layer, and a cathode which are sequentially disposed on the substrate. The anode may be arranged in a pattern having a one-to-one correspondence to the light-emitting units, and the cathode is formed to cover the entire surface.

Therefore, each of the convex structures T located on the light-emitting side of the light-emitting unit can be correspondingly arranged with the size of the anode, covering at least the region where the anode is located.

Figure 11:
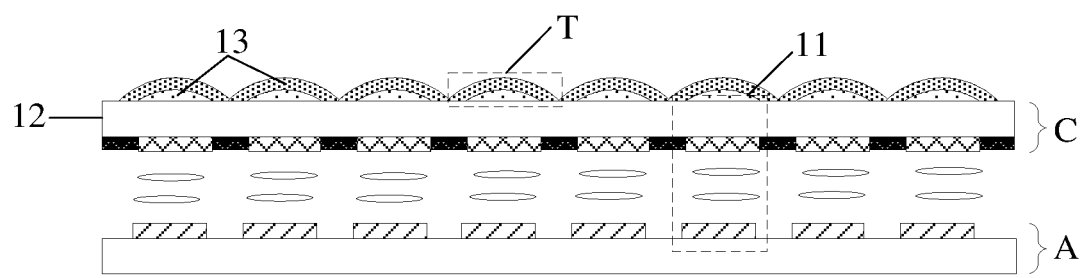
FIG. 11 is a further exemplary schematic diagram showing a cross-sectional structure of a display panel according to some embodiments of the present disclosure.

Referring to FIG. 11, there is shown an exemplary embodiment in which the display panel is a liquid crystal display panel. The liquid crystal display panel includes: an array substrate A and an opposite substrate C.

Light of the liquid crystal display panel is generally emitted from the opposite substrate C side. The base substrate in the substrate C can function as the above-described transparent substrate 12. The above transparent film layer 13 is formed on the surface of the base substrate of the counter substrate, and the difference in brightness of the display panel at different viewing angles can be improved.

According to a second aspect of the present disclosure, there is also provided a display apparatus, including any of the above display panels. The display apparatus can be a liquid crystal display, a liquid crystal television, an OLED panel, an OLED display, an OLED television, or an electronic paper. The principle of the display apparatus is similar to that of the above display panel. Therefore, the implementation of the display apparatus can be referred to the implementation of the above display panel, and the repeated description is omitted.

The display apparatus can include other components to drive or function with the display panel. For example, a pixel control circuit can be included to drive the plurality of light emitting units or pixels. The pixel control circuit can include, for example, a plurality of thin-film transistors (TFTs).

In the case of an OLED display apparatus, the display panel can be an active-matrix organic light-emitting diode (AMOLED) display, comprising an active matrix of OLED pixels integrated onto a TFT array.

A power control circuit can be included to control the power to the display apparatus. One or more speakers can be included to provide audio effects in addition to the pictures or videos shown on the display panel.

The resulting display apparatus therefore can be a TV, a computer, a tablet computer, a mobile phone, a lighting system, a signage, etc.

Figure 12:
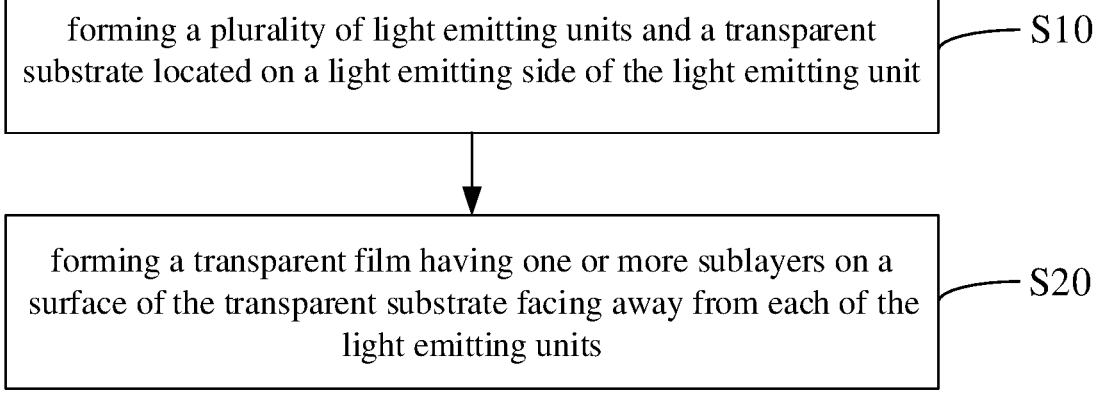
FIG. 12 is a flowchart of a method for manufacturing a display panel according to some embodiments of the present disclosure.

In a third aspect, various embodiments of the present disclosure also provide a method for fabricating a display panel. As shown in FIG. 12, the foregoing manufacturing method provided by the embodiment of the present disclosure may include the following steps:

S10, forming a plurality of light emitting units and a transparent substrate located on a light emitting side of the light emitting unit;

S20, forming a transparent film having one or more sublayers on a surface of the transparent substrate facing away from each of the light emitting units.

The refractive index of each transparent film sublayer is smaller than the refractive index of the transparent substrate; the refractive index of each transparent film sublayer decreases progressively along the light emitting direction of the light emitting unit, i.e. the sublayer closest to the light emitting elements has the largest refractive index while the sublayer furthest away from the light emitting elements has the smallest refractive index.

The display panel manufactured by the above-described manufacturing method provided by the embodiments of the present disclosure has the advantage that the transparent film sublayers have refractive indices that are progressively reduced from that of the transparent substrate, thereby, creating a cascading layers of transparent films with progressively decreasing refractive indices so that the critical angle at the interfaces of each medium layer is increased, and more light at larger incident angles are allowed to passthrough, alleviating the problem of low light intensity at a large viewing angle.

In actual manufacturing process, each transparent film sublayer located on the light exiting side of the transparent substrate may be formed in a geometric shape conducive to increasing critical angles at the interfaces, including convex structure(s), in some embodiments having a one-to-one correspondence to the light emitting units.

In some embodiments, in the above step S20, at least one transparent film sublayer is formed on a surface of the transparent substrate facing away from each of the light emitting units, including:

forming a transparent film have one or more sublayers layer-by-layer on a surface of the transparent substrate facing away from each light emitting unit; and configuring the film sublayers formed in this way to form one or more convex structures each corresponding to a light emitting unit.

In these embodiments, the transparent film sublayers thus formed can be patterned all at once to form one or more convex structures with a one-to-one correspondence to each of the light-emitting units.

The patterning process can adopt an etching process in which a halftone mask may be used for patterning the transparent film sublayers so that when the transparent film sublayer is exposed, the etching depth of the edge of the transparent region may be greater than the etching depth of the central region so as to form the above convex structure.

In this way, each sub-layer of the transparent film layer and the transparent substrate can form a certain slope, which is favorable for the exit of large-angle light.

In some other embodiments, the foregoing step S20 comprises forming a transparent film layer having one or more sublayers on a surface of the transparent substrate facing away from each of the light emitting units, including:

forming the transparent film layer sublayer-by-sublayer on the surface of the transparent substrate facing away from the light-emitting units; and patterning all the formed transparent film sublayers in one single patterning process to form one or more convex structures.

In some embodiments, the one or more convex structures can have one-to-one correspondence to each of the light-emitting units.

In the above embodiments, after all of the transparent film sublayers are formed, they are etched using only one single patterning process, thereby, forming a convex structure in a one-to-one correspondence with the light-emitting units. The patterning process may employ an etching process, which may be performed by using a halftone mask.

The one or more convex structures formed in this manner will have a slope between the outermost transparent film sublayer and the transparent substrate which functions to improve the exit angles of the emitted light. Because this manufacturing process only needs to etch the transparent film layer once, which greatly simplifies the manufacturing process.

In the above manufacturing methods provided by the embodiments of the present disclosure, the patterning process is not limited only to etching process but may also advantageously use other fabrication processes known in the art capable of forming the above-mentioned pattern.

In some implementations, the manufacturing method for the OLED light-emitting apparatus can include the following operations.

First, providing a substrate, over which an anode is formed.

Next, a pixel defining layer is formed over the anode.

An organic functional layer can then be formed over the anode at which the pixel defining layer is formed.

A cathode can then be formed over the organic functional layer.

The organic functional layer corresponds to the light-emitting area as a light-emitting surface.

Using a variable transmittance mask on the outer glass corresponding to the light-emitting surface, a chemical vapor deposition (CVD) process can be employed to deposit the variable-refractive-index layer.

For example, the deposited variable-refractive-index layer can include first a MgF2 (n=1.4) film layer, and then a cryolite (n=1.33) film layer. After forming the MgF2 film layer, an edge layer of the MgF2 film layer has a tangential angle limited to be >20°, and an edge layer of the cryolite film layer has a tangential angle limited to be >20°.

Alternatively, the MgF2 film layer and the cryolite film layer can be vapor-deposited in sequence, and after exposure with a variable transmittance mask, a convex structure can be formed on the surface of the cryolite film layer, with a tangential angle at the edge layer of the film layer cut by >20°.

Figure 13:
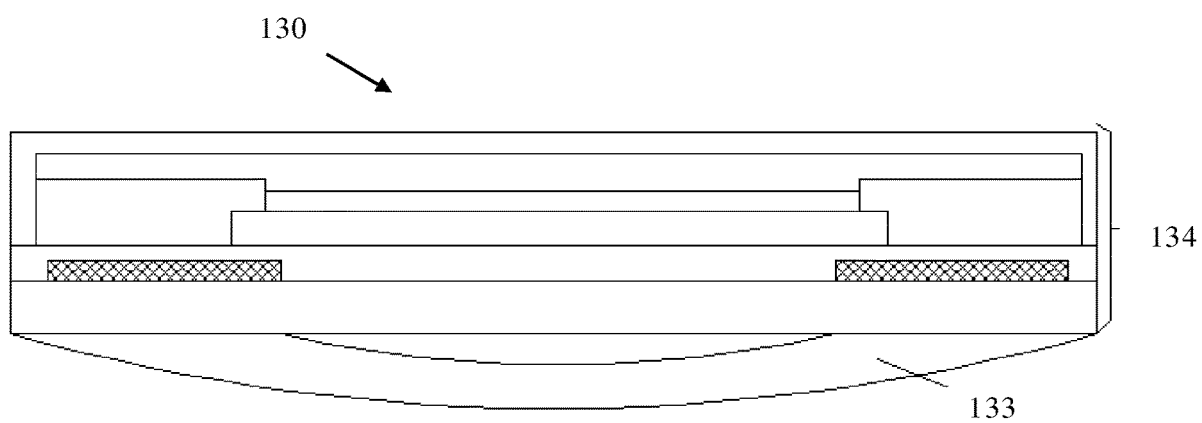
FIG. 13 is a schematic structural diagram of a cross-section of a pixel unit according to some embodiments of the present disclosure.

The resulting display apparatus can have a pixel structure as illustrated in FIG. 13.

FIG. 13 is a schematic structural diagram of a cross-section of a pixel unit 130 according to some embodiments of the present disclosure.

As shown, the pixel unit 130 can include the variable-refractive-index layer 133, and the pixel structure 134. The variable-refractive-index layer 133 can include the MgF2 film layer, and the cryolite film layer.

In some embodiments, the variable-refractive-index layer 133 does not necessarily including multiple film layers each with different refractive indices thereby effectively forming a variable refractive index along the light emission direction. Rather, the variable-refractive-index layer 133 can be a single layer instead, and realize a gradually varying, or stepped, refractive index through doping or through a variation in the material composition of the variable-refractive-index layer 133.

The variable-refractive-index layer 133 in some embodiments can comprise multiple sublayers, and in some other embodiments can have a single layer with variable doping/composition. In both cases, the variable-refractive-index layer 133 can have an effective refractive index smaller than a refractive index of the transparent substrate.

The display panel, the manufacturing method thereof and the display apparatus provided by the embodiment of the disclosure can include: a plurality of light-emitting units, a transparent substrate located on the light-emitting side of the light-emitting unit, and a transparent film having one or more sublayers on a side of the transparent substrate facing away from each light-emitting unit.

The refractive index of each transparent film sublayer is smaller than the refractive index of the transparent substrate; the refractive index of each transparent film sublayer decreases progressively along the light emitting direction of the light emitting unit.

At least one transparent film sublayer whose refractive index is progressively smaller is disposed on the transparent substrate on the light-emitting side of the light-emitting unit, so that the difference in refractive index of the medium when the light is emitted to the outside of the transparent substrate is reduced, such that the critical angle is increased at the interface of the two media, and the light incident at a large angle can be emitted, thereby alleviating the problem of low light intensity at a large viewing angle.

As this refractive index grading film layer is disposed at the OLED light emitting surface, and the film layer has a non-planar structure, while protruding toward the light emitting surface, a uniformly arranged convex structure can be formed.

Through the gradient of the refractive index, the total reflection angle of the light interface is increased, and the incident angle of the interface is reduced by the convex structure, thereby comprehensively reducing the variation of the brightness difference at different viewing angles of the OLED apparatus.

As such, the picture brightness uniformity across different viewing angles is improved, as is the display apparatus display quality. That is, brightness differences viewed from different viewing angles can be minimized.

It should be understood that "a plurality" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on," a second element may indicate direct contact between the first and second elements, without contact, or indirect through an intermediate medium, unless otherwise explicitly stated and defined.

In the description of the present disclosure, the terms "some embodiments," "example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features can be described above as acting in certain combinations and even initially claimed as such, one or more features from a claimed combination can in some cases be excised from the combination, and the claimed combination can be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A display panel, comprising:
   a plurality of light emitting units each having a light emitting side and a back side;
   a transparent substrate disposed over the light emitting side of the light emitting unit;
   a transparent film disposed over a side of the transparent substrate opposing the light emitting unit,
   wherein:
   the transparent film has an effective refractive index smaller than a refractive index of the transparent substrate;
   the transparent film has a position-dependent refractive index progressively smaller along a light emitting direction from the light emitting unit;
   the transparent film is patterned as a plurality of convex structures protruding away from the plurality of light emitting units;
   the plurality of convex structures and the plurality of light emitting units have a one-to-one correspondence;
   each of the plurality convex structures comprises at least a first transparent film sublayer and a second transparent film sublayer, with the first sublayer being closer to the plurality of light emitting units and the second sublayer being farther away from the light emitting units; and
   the first sublayer comprises magnesium fluoride, and the second sublayer comprises cryolite.

2. The display panel of claim 1, wherein each of the plurality of convex structures is configured to have a centrally symmetric shape with respect to an equivalent illuminating center point of a corresponding light emitting unit.

3. The display panel of claim 2, wherein each of the plurality convex structures is configured to be a spherical cap that is smaller or equal to a hemisphere or a conic shape.

4. The display panel of claim 1, wherein:
   the first sublayer has an edge with a plane section forming an angle with the surface plane of the transparent substrate that is equal to or greater than 20 degrees; and
   the second sublayer has an edge with a plane section forming an angle with the surface plane of the transparent substrate that is equal to or greater than 20 degrees.

5. The display panel of claim 1, wherein the transparent film has a gradually varying refractive index through doping or through a gradual variation in a material composition along the light emitting direction from the light emitting unit.

6. The display panel of claim 1, wherein the transparent film has stepped refractive indices through stepped doping or through stepped variation in a material composition along the light emitting direction from the light emitting unit.

7. The display panel of claim 1, wherein:
   the transparent film comprises a plurality of sublayers; and
   each of the plurality of sublayers has a refractive index progressively smaller than a refractive index of a previous layer that is closer to the light emitting unit.

8. The display panel of claim 7, wherein the plurality of sublayers comprises:
   a first layer proximal to the light emitting unit and having a first refractive index of 1.4; and
   a second layer over the first layer and having a second refractive index of 1.33.

9. A display apparatus comprising the display panel of claim 1, and further comprising a control circuit including an array of thin-film transistors (TFTs).

10. A display panel, comprising:
a plurality of light emitting units each having a light emitting side and a back side;
a transparent substrate disposed over the light emitting side of the light emitting unit;
a transparent film disposed over a side of the transparent substrate opposing the light emitting unit,
wherein:
the transparent film has an effective refractive index smaller than a refractive index of the transparent substrate;
the transparent film has a position-dependent refractive index progressively smaller along a light emitting direction from the light emitting unit;
the transparent film comprises a plurality of sublayers; and
each of the plurality of sublayers has a refractive index progressively smaller than a refractive index of a previous layer that is closer to the light emitting unit;
wherein the plurality of sublayers comprises:
a first layer proximal to the light emitting unit and having a first refractive index of 1.4; and
a second layer over the first layer and having a second refractive index of 1.33;
wherein:
the first layer comprises MgF2; and
the second layer comprises cryolite.

11. The display panel of claim 10, wherein:
the first sublayer has an edge with a plane section forming an angle with the surface plane of the transparent substrate that is equal to or greater than 20 degrees; and
the second sublayer has an edge with a plane section forming an angle with the surface plane of the transparent substrate that is equal to or greater than 20 degrees.

12. The display panel of claim 1, wherein:
each of the plurality of light emitting units comprises a top emitting organic light-emitting diode (OLED);
the display panel further comprises: a base substrate and a protective cover that functions as the transparent substrate; and
each of the plurality of light emitting units is disposed between the base substrate and the protective cover.

13. The display panel of claim 1, wherein:
each of the plurality of light emitting units comprises a bottom emitting organic light-emitting diode (OLED);
the display panel further comprises: a base substrate and a protective cover that functions as the transparent substrate; and
each of the plurality of light emitting units is disposed between the base substrate and the protective cover.

14. A method of manufacturing a display panel, comprising:
forming a plurality of light emitting units and a transparent substrate disposed on a light emitting side of the plurality of light emitting units;
disposing a transparent film on a side of the transparent substrate that is opposing the plurality of light emitting units, wherein the transparent film comprises a plurality of sublayers;
wherein each sublayer of the transparent film has a refractive index smaller than that of the transparent substrate, and each sublayer's refractive index is progressively smaller than the previous sublayer ordered in a light-emitting direction; and
forming an anode over the transparent substrate;
forming a pixel defining layer over the anode;
forming an organic functional layer over the anode at which the pixel defining layer is formed;
forming a cathode over the organic functional layer;
wherein the organic functional layer corresponds to a light-emitting area at the light-emitting side;
depositing, with a chemical vapor deposition (CVD) process, the transparent film including a MgF2 film sublayer, and a cryolite (n=1.33) film sublayer;
performing exposure with a variable transmittance mask; and
forming a convex structure over surface of the cryolite film sublayer, having an edge with a plane section forming an angle with the surface plane of the transparent substrate that is equal to or greater than 20 degrees.

15. The method of claim 14, further comprising:
forming the plurality of sublayers one layer at a time, and patterning each sublayer into a plurality of convex structures after each sublayer is formed, wherein each of the plurality of convex structures corresponds to a light emitting unit in a one-to-one correspondence.

16. The method of claim 14, further comprising:
forming the sublayers one layer at a time, and patterning the entire transparent film to form a plurality of convex structures in a single patterning process after all the sublayers are formed, wherein each of the plurality of convex structures correspond to each light emitting units in a one-to-one correspondence.

* * * * *